(12) United States Patent
Kwon

(10) Patent No.: US 7,199,623 B2
(45) Date of Patent: Apr. 3, 2007

(54) METHOD AND APPARATUS FOR PROVIDING A POWER-ON RESET SIGNAL

(75) Inventor: Kee-Won Kwon, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 100 days.

(21) Appl. No.: 10/968,018

(22) Filed: Oct. 20, 2004

(65) Prior Publication Data
US 2005/0270077 A1 Dec. 8, 2005

(30) Foreign Application Priority Data
Jun. 3, 2004 (KR) .................. 10-2004-0040396

(51) Int. Cl.
*H03L 7/00* (2006.01)
(52) U.S. Cl. ..................... 327/143; 327/198
(58) Field of Classification Search ............. 327/142, 327/143, 198
See application file for complete search history.

(56) References Cited

U.S. PATENT DOCUMENTS

| | | | | | |
|---|---|---|---|---|---|
| 5,130,569 | A | * | 7/1992 | Glica .......................... | 327/143 |
| 5,442,312 | A | * | 8/1995 | Walter ......................... | 327/198 |
| 5,691,887 | A | * | 11/1997 | Sher ............................ | 363/49 |
| 5,825,220 | A | * | 10/1998 | Kinugasa et al. ............. | 327/143 |
| 5,929,673 | A | * | 7/1999 | Haigis et al. ................ | 327/143 |
| 6,104,221 | A | * | 8/2000 | Hoon ........................... | 327/143 |
| 6,144,237 | A | * | 11/2000 | Ikezaki ........................ | 327/143 |
| 6,204,701 | B1 | * | 3/2001 | Tsay et al. ................... | 327/143 |
| 6,204,704 | B1 | * | 3/2001 | Williams et al. ............. | 327/143 |
| 6,556,058 | B2 | * | 4/2003 | Ohbayashi et al. .......... | 327/143 |
| 6,809,565 | B2 | * | 10/2004 | Kawakubo .................... | 327/143 |
| 2004/0012418 | A1 | * | 1/2004 | Kim .............................. | 32/143 |

FOREIGN PATENT DOCUMENTS

| | | |
|---|---|---|
| JP | 06-196989 | 7/1994 |
| JP | 10-255465 | 9/1998 |

* cited by examiner

*Primary Examiner*—Linh My Nguyen
*Assistant Examiner*—Thomas J. Hiltunen
(74) *Attorney, Agent, or Firm*—Harness, Dickey & Pierce, P.L.C.

(57) ABSTRACT

A power-on reset circuit and method for the same may provide reset signals during power-up and/or power-down cycles, to reduce the chances of error. An error may occur, for example, due to voltage fluctuations and/or the ambient temperature of circuit components. Reducing the chances of error during a power-up cycle may include setting an output node of a circuit to a reset state when a power supply voltage reaches a first voltage level and outputting a power-on reset signal to the output node when the power supply voltage equals a second voltage level higher than the first. Reducing the chances of error during a power-down cycle may include setting the output node to a reset state when the output node reaches a third voltage level between the first and second voltage levels.

38 Claims, 7 Drawing Sheets

METHOD AND APPARATUS FOR PROVIDING A POWER-ON RESET SIGNAL

CROSS-REFERENCE TO RELATED APPLICATIONS

This U.S. nonprovisional patent application claims priority under 35 U.S.C. § 119 of Korean Patent Application 2004-40396 filed on Jun. 3, 2004, the contents of which are herein incorporated by reference in their entirety.

BACKGROUND OF THE INVENTION

1. Field of this Invention

The present invention relates to a power-on reset circuit, which may include a reset-on state during power-up and/or power-down cycles of operation.

A power-on reset circuit may generate a power-on reset signal (hereinafter referred to as "POR signal") for example, to enable operation of a semiconductor device system, when a power supply voltage reaches a certain level. If a voltage variation occurs during an initial operation state, the system may incur unexpected errors. The POR signal may protect the system from these types of errors. Therefore, a power-on reset circuit may be designed to delay a POR signal output until a power supply voltage has been activated.

2. Description of the Related Art

The configuration and operational characteristics of a conventional power-on reset circuit are illustrated in FIGS. 1 and 2.

Referring to FIG. 1, a conventional power-on reset circuit may include M PMOS transistors, MP1–MPM (M being a positive integer), resistors R1 and R2, N NMOS transistors, MN1–MNN (N being a positive integer), and an inverter IV1.

The PMOS transistors MP1–MPM may be serially coupled between a power supply voltage, for example VCC, and one end of the resistor R1. The gates of the PMOS transistors MP1–MPM may be connected to the drain of the PMOS transistor MPM and to one end of resistor R1, and the other end of resistor R1 may be connected to a voltage ground. The gates of the NMOS transistors MN1–MNN may also be connected to the drain of the PMOS transistor MPM, gates of the PMOS transistors MP1–MPM, and one end of the resistor R1. A connection node may be commonly connected to the drain of the PMOS transistor MPM, the gates of the PMOS transistors MP1–MPM, and one end of the resistor R1. One end of the resistor R2 may be connected to a power supply voltage, for example VCC, and the other end of R2 may be connected to an input port of the inverter IV1 and the drain of the NMOS transistor MN1. The inverter IV1 may be coupled to an output port for outputting a POR signal.

The operation of the power-on reset circuit illustrated in FIG. 1 will now be described with reference to FIG. 2, which illustrates a generation time for a POR signal that varies based on temperature.

A low-temperature characteristic illustrated by a fine line in FIG. 2 will now be described. As a power supply voltage VCC rises, a voltage signal POUT, corresponding to the connection node CN1 illustrated in FIG. 1, may increase to a low threshold voltage level $VTN_L$ illustrated in FIG. 2. $VTN_L$ corresponds to the threshold voltages of the PMOS transistors MP1–MPM, and is based on the rise of power supply voltage VCC. A difference between the power supply voltage VCC and the signal $POUT_L$ may be based on the body effect of the PMOS transistors MP1–MPM and $VTN_L$.

A high-temperature characteristic illustrated by a bold line in FIG. 2 will now be described. If the voltage POUT of the connection node CN1, illustrated in FIG. 1, becomes higher than a high level threshold voltage $VTN_H$ corresponding to the NMOS transistors MN1-MNN, then each of the NMOS transistors MN1–MNN may be turned on. If each of the NMOS transistors MN1–MNN turn on, the inverter IV1 may output a power on reset signal 'high' $POR_H$. The $POR_H$ signal may represent a higher turn-on speed due to a higher temperature, accordingly the $POR_H$ signal may be faster than the $POR_L$ by a time margin of 'T1'. The $POR_H$ signal may be output from the inverter IV1 of FIG. 1 when a high temperature is activated, similarly the $POR_L$ signal may be output when a low temperature is activated.

Resistors R1 and R2 may have relatively high values when compared to a low standby current, and the transition time of a POR signal may depend on the threshold voltages of transistors. Since a threshold voltage of a transistor may vary with temperature, the transition time of the POR signal may also vary with temperature. Therefore, if the ambient temperature of the transistors is higher than expected then a POR signal may be generated before a power supply voltage rises, which may be required for regular system operation.

A conventional power-on reset circuit may consume extra power because standby current may be continuously generated from a power terminal even after generating a POR signal. If each node of a POR circuit is in a specific state or the effect of a parasitic capacitance is great, a POR signal may continuously increase with the rise of a power supply voltage, thus no reset signal may be generated.

SUMMARY OF THE INVENTION

Exemplary embodiments of the present invention may provide a power-on reset circuit that includes a power-on state for power-up and/or power-down cycles.

An exemplary embodiment of the present invention may provide a power-on reset circuit that includes, a reset circuit, which may generate a reset voltage when a power supply voltage reaches a first voltage level. The power-on reset circuit further provides a level detector, which may generate a detection voltage when the power supply voltage reaches a second voltage level higher than the first voltage level, and a latch circuit, which may receive a reset voltage from the reset circuit for resetting an output node, and may also receive a detection voltage from the level detector to output a power-on reset signal through the output node and to latch the power-on reset signal. The latch circuit may reset the output node when a voltage of the output node reaches a third voltage level that is lower than the second voltage level and higher than the first voltage level.

Exemplary embodiments of the present invention may provide a power-on reset circuit that includes a switch, which may be used to cut off a power supply voltage supplied to the level detector in response to the power-on reset signal.

Another exemplary embodiment of the present invention may provide a power-on reset circuit that includes, a reset circuit, which may generate a reset signal when a power supply voltage is higher than a first voltage level. The power-on reset circuit may further provide a level detector, which may generate a detection voltage when the power supply voltage reaches a second voltage level higher than the first voltage level. The power-on reset circuit may also provide a latch circuit, which may receive the reset signal and reset the output node, and receive the detection voltage and output a power-on reset signal through the output node and latch the power-on reset signal. The reset circuit may be coupled between a power terminal and a first node, the level detector may be coupled between the power terminal and the first node, and the latch circuit may be coupled between the first node and the output node. The latch circuit may receive the reset voltage to reset the output node when a voltage of the output node reaches a third voltage level lower than the second voltage level and higher than the first voltage level.

Exemplary embodiments of the present invention may include a reset circuit that has one or more PMOS transistors serially coupled between the power terminal and the first node. The gates of the PMOS transistors may be grounded, and the threshold voltages of the PMOS transistors may be the same as the first voltage level.

Exemplary embodiments of the present invention may further include a level detector having a voltage distribution circuit and a common-source amplifier. The common-source amplifier may include one or more NMOS transistors that are serially coupled between the first node and a ground. The voltage distribution circuit may distribute voltage to gates of the NMOS transistors.

Another exemplary embodiment of the present invention may provide a method for outputting a power-on reset signal through an output node of a power-on reset circuit. The method for outputting a power-on reset signal may include, resetting an output node of the power-on reset circuit when a power supply voltage reaches a first voltage level, outputting a power-on reset signal through the output node when the power supply voltage reaches a second voltage level higher than the first voltage level, and resetting the output node when a power supply voltage reaches a third voltage level that is lower than the second voltage level and higher than the first voltage level.

Another exemplary embodiment of the present invention may provide a method for outputting a power-on reset signal through an output node of a power-on reset circuit, and may include the following. Generating a reset voltage when a power supply voltage reaches a first voltage level, resetting the output node in response to the reset voltage, generating a detection voltage when a power supply voltage reaches a second voltage level higher than the first voltage level, outputting a power-on reset signal through the output node in response to the detection voltage, and resetting the output node when a voltage of the output node becomes lower than the second voltage level and higher than the first voltage level.

Exemplary embodiments of the present invention may further include cutting off the generation of a detection voltage in response to a power-on reset signal.

The exemplary embodiments described in detail below may provide lower power consumption and/or higher tolerance to variations in the ambient temperature of circuit components than in previous power-on reset circuit configurations.

DETAILED DESCRIPTION OF THE EXEMPLARY EMBODIMENTS OF THE PRESENT INVENTION

Figure 1:
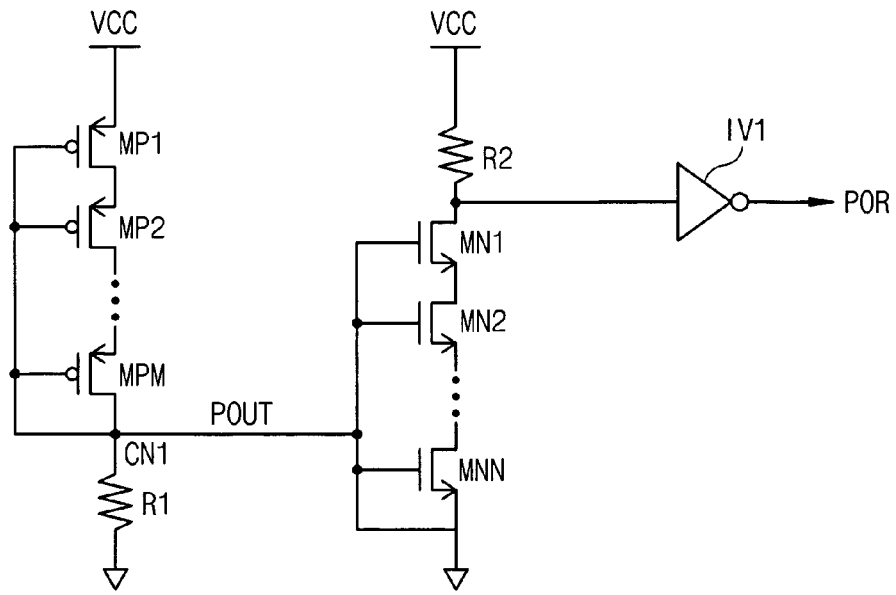
FIG. 1 illustrates a circuit diagram of a conventional power-on reset circuit.
Figure 2:
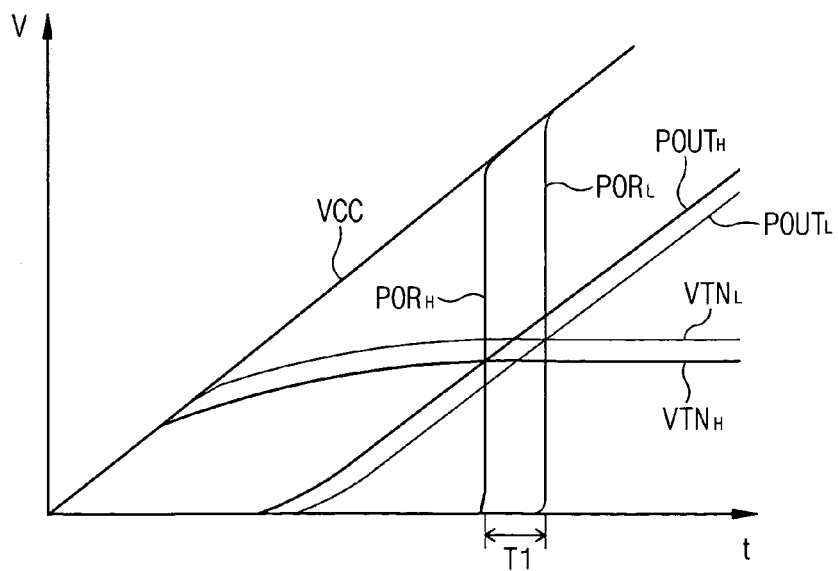
FIG. 2 illustrates a timing diagram of the power-on reset circuit of FIG. 1.
Figure 3:
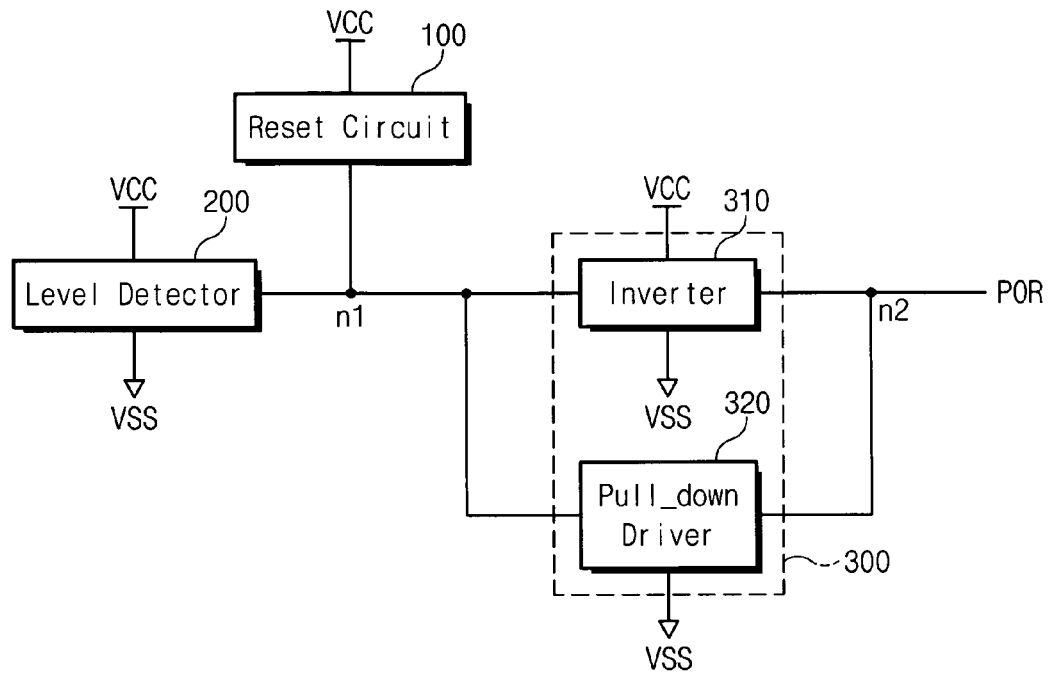
FIG. 3 is a block diagram illustrating a power-on reset circuit according to an exemplary embodiment of the present invention.

FIG. 3 illustrates a power-on reset circuit including a reset circuit 100, a level detector 200, and a latch circuit 300, according to an exemplary embodiment of the present invention.

The reset circuit 100 may be coupled between a power terminal and a first node n1 and may be configured to generate a reset voltage signal. The reset circuit 100 may generate a reset voltage signal when the power supply voltage level VCC reaches a first specified voltage level. The level detector 200 may be coupled between the power terminal and the first node n1 and may generate a detection voltage signal when the power supply voltage reaches a second specified voltage level higher than the first specified voltage level.

The latch circuit 300 may include an inverter 310 and a pull-down driver 320, coupled between the first node n1 and a second node n2. Upon power-up, the latch circuit 300 may receive a reset voltage signal from reset circuit 100 for resetting node n2, and may receive a detection voltage signal from level detector 200 for outputting a POR through node n2.

The pull-down driver 320 may latch an output signal of node n2 when a voltage of n2 reaches a third specified voltage level higher than the first specified voltage level and lower than the second specified voltage level. Thus, upon power-up, the pull-down driver 320 may latch a power-on reset signal output from node n2. However, when the voltage of node n2 is lower than the third specified voltage level, the pull-down driver 320 may not latch the output signal of node n2, hence a latch break may occur. Upon power-up, the pull-down driver 320 may latch the output signal of node n2 when the voltage of n2 is higher than the third specified voltage level. Upon power-down, the pull-down driver 320 may perform a latch break for the output signal of n2 when the voltage level of n2 is lower than the third voltage.

Upon power-up, the latch circuit 300 may receive a reset voltage signal, from the reset circuit 100, to reset node n2 when the output signal of n2 is subject to a latch break.

The power-on reset circuit, according to an exemplary embodiment of the present invention, may permit node n2 to enter a reset-on state, which may reduce the chances that unexpected system errors occur. An example of an unexpected system error may be a voltage variation occurring in an initial state.

Figure 4:
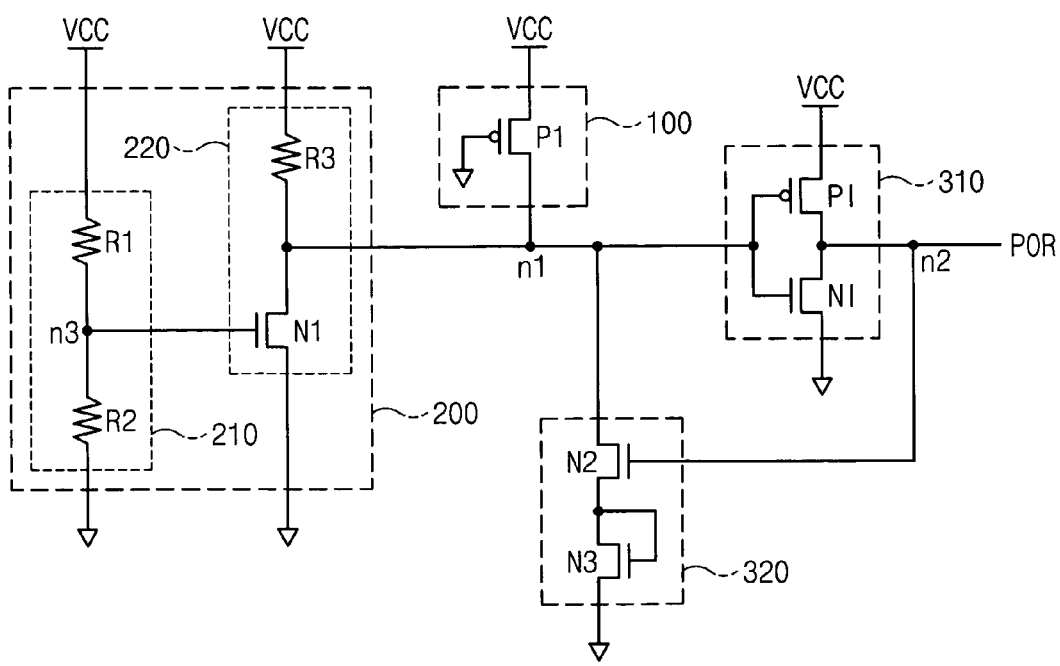
FIG. 4 illustrates an example circuit diagram of the power-on reset circuit of FIG. 3.

FIG. 4 illustrates an example circuit diagram corresponding to the block diagram of FIG. 3. Referring to FIG. 4, the reset circuit 100 may include a PMOS transistor P1 coupled between a power terminal and a first node n1. The source of P1 may be coupled to the power terminal, the drain of P1 may be coupled to node n1, and the gate of P1 may be grounded. P1 may be turned on when the power supply voltage VCC, applied to the source of P1, becomes higher than the threshold voltage level VP1 of P1. If P1 is turned on, a current path may be established between the power terminal and the first node n1, thus applying a reset voltage to n1.

The level detector 200, illustrated in an exemplary embodiment of FIG. 4, may include a voltage distribution circuit 210 and a common-source amplifier 220. The voltage distribution circuit 210 may include resistors R1 and R2 which are serially coupled between a power terminal and a ground, and may be interconnected via a third node n3. A distribution voltage at n3, according to the voltage distribution formula, may be calculated as $$\frac{R2}{R1+R2}VCC.$$

The common-source amplifier 220 may include a resistor R3 coupled between a power terminal and a first node n1, and an NMOS transistor N1 coupled between n1 and ground. The drain of N1 may be connected to the first node n1, and the source of N1 may be grounded. The gate of the NMOS transistor N1 may be connected to the third node n3. If a distribution voltage applied to the gate of N1 is higher than a threshold voltage VN1 of N1, then N1 may be turned on. If N1 is turned on, a current path may be established between n1 and ground, thus a detection voltage may be applied to n1.

The latch circuit 300, illustrated in an exemplary embodiment of FIG. 3, may include an inverter 310 and a pull-down driver 320. Referring to FIG. 4, the inverter 310 may be coupled between the first node n1 and a second node n2 and may include a PMOS transistor PI and an NMOS transistor NI. The pull-down driver 320 may include two NMOS transistors N2 and N3 serially coupled between the first node n1 and ground. The drain of N2 may be connected to the first node n1, and the gate of N2 may be connected to the second node n2. The source of N2 is connected to the drain and the gate of N3, and the source of N3 is grounded.

If VN2 and VN3 represent threshold voltages of NMOS transistors N2 and N3 respectively, a threshold voltage of the pull-down driver 320 would be VN2+VN3. If a voltage at node n2 is higher than VN2+VN3, then N2 and N3 may be turned on to establish a current path between n1 and ground, and to latch an output signal at n2. On the other hand, if the voltage at n2 is lower than VN2+VN3, then the NMOS transistors N2 and N3 may be turned off, thus performing a latch break at n2.

Figure 5:
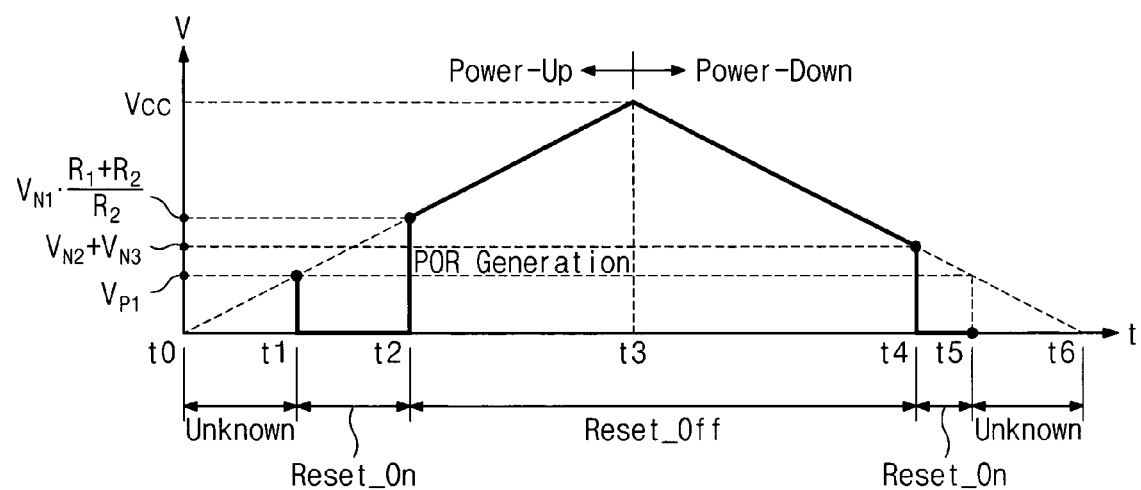
FIG. 5 is an example timing diagram illustrating the operational characteristics of the power-on reset circuit of FIG. 4.

Referring to FIGS. 4–5, according to an exemplary embodiment of the present invention, in an initial state to, a voltage level of the second node n2 may be in an unknown state, as illustrated in FIG. 5. If a power supply voltage VCC reaches a threshold voltage VP1 of PMOS transistor P1, at a time t1 for example, then P1 may be turned on. If the PMOS transistor P1 is turned on, a reset voltage may be applied to a first node n1 and a second node n2 may then be in a reset-on state.

If the power supply voltage VCC rises and a voltage of the third node n3 reaches the threshold voltage VN1 of the NMOS transistor N1, illustrated in FIG. 4, where $$\left(\frac{R2}{R1+R2}VCC = VN1 \rightarrow VCC = VN1\frac{R1+R2}{R2}\right),$$

then the NMOS transistor N1 may be turned on. If the NMOS transistor N1 is turned on, a detection voltage may be applied to the first node n1, and the second node n2 may then be in a reset-off state. If n2 is in a reset-off state, then n2 may output a POR signal.

If a voltage of the second node n2 drops below a threshold voltage of the pull-down driver 320, which may be represented by the sum of the threshold voltages (VN2+VN3) of NMOS transistors N2 and N3, then N2 and N3 may be turned off. As illustrated in FIG. 5, upon power-down (starting at about time t3) for example at time t4, the NMOS transistors N2 and N3 may be turned off, while the PMOS transistor P1 of the reset circuit 100 may be turned on. If P1 is turned on then a reset voltage may be applied to the first node n1, thus enabling a current path to make the second node n2 return to a reset-on state.

If, for example, a power supply voltage continuously drops and the voltage of the second node n2 drops below the threshold voltage VP1 of the PMOS transistor P1, as illustrated in FIG. 5 at time t5, then the PMOS transistor P1 may be turned off. If P1 is turned off then the second node n2 may be in an unknown state, where it is uncertain whether n2 is in the reset-on or reset-off state.

As illustrated in FIG. 5, the power-on reset circuit shown in FIG. 4 may have a reset-on state during the t1–t2 time period upon power-up, and during the t4–t5 time period upon power-down.

In an exemplary embodiment of FIG. 4, the resistors R1 and R2 of the level detector 200 may regulate a transition voltage $$VN1\frac{R1+R2}{R2},$$

where VN1 is the threshold voltage of NMOS transistor N1, in order to generate a POR signal. The power supply voltage VCC may be distributed through the resistors R1 and R2. The distributed voltage may be amplified by the common-source amplifier 220.

The voltage gain of the common-source amplifier 220, according to an exemplary embodiment of the present invention, may be adjusted by its size, for example the length and/or width values, of the NMOS transistor N1 and/or the value of the resistor R3. Adjustments to these values may be made desired to produce a common-source amplifier 220 voltage gain that is close to '–1'. The voltage gain (Gain) of the common-source amplifier 220 may be calculated by the following:

$$\text{Gain} = \left(\frac{R2}{R1+R2}\right) \times g(m) \times R3$$

wherein the function g(m) represents a transconductance of the NMOS transistor N1.

The transconductance g(m) of the NMOS transistor N1 may be proportional to the size or aspect ratio of the NMOS transistor N1, i.e., W0/L0 (L0 being a length and W0 being a width of N1). The aspect ratio, W0/L0 may have a small value, thus the gain of the common-source amplifier 220 may be close to A characteristic of the inverter 310 may be similar to a large common-source MOS transistor. In the inverter 310, the aspect ratio of the PMOS transistor PI, denoted for example W1/L1, may be smaller than the aspect ratio of the NMOS transistor NI, denoted W2/L2.

As illustrated in FIG. 4, according to an exemplary embodiment of the present invention, a voltage distribution circuit 210 need not include both one or more MOS transistors and/or a resistor, but may include only resistors. The preclusion of one or more MOS transistors may reduce the ambient temperature dependency found in the threshold voltages of MOS transistors. If, for example, a gain of the common-source amplifier 220 is set to about '−1' and the inverter 310 has an NMOS transistor NI with an aspect ratio W2/L2, which is significantly greater than an aspect ratio W1/L1 of the PMOS transistor PI, then the temperature dependency of these transistors may be reduced. Therefore, reducing the temperature-based dependency of a power-on reset circuit.

Figure 6:
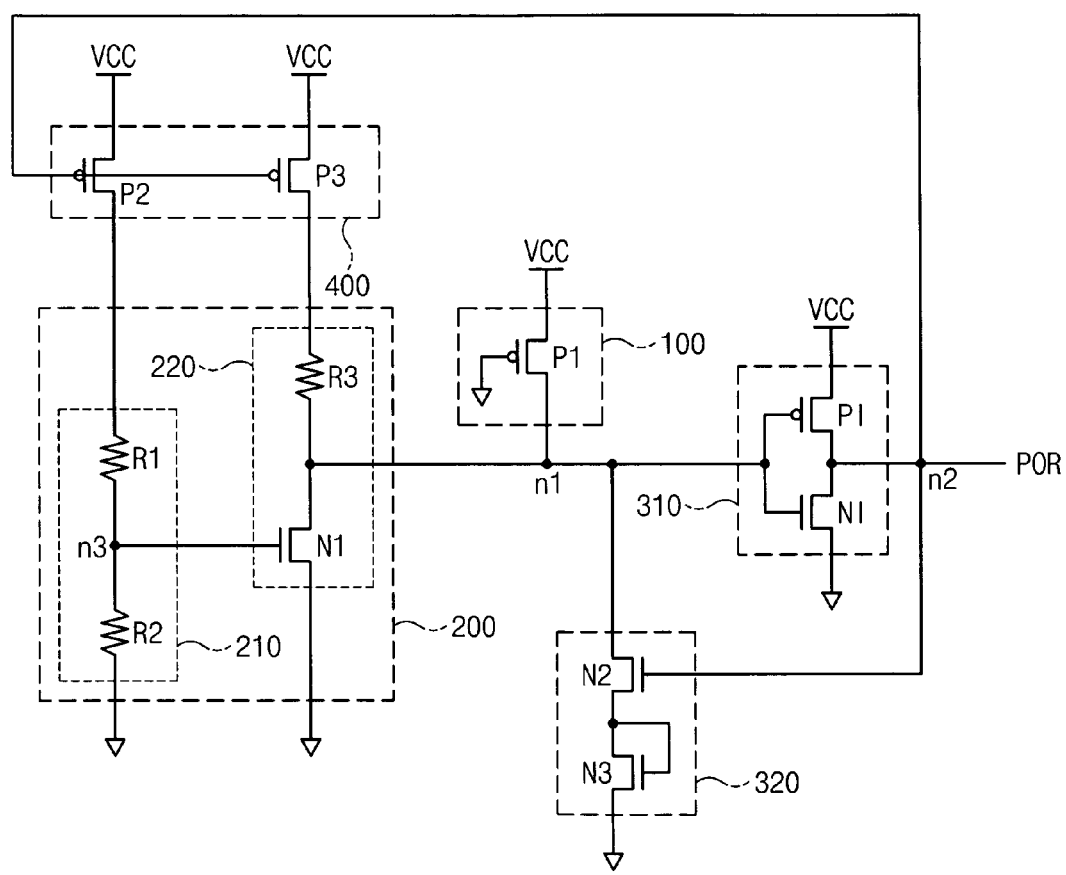
FIG. 6 is an example circuit diagram illustrating a power-on reset circuit according to another exemplary embodiment of the present invention.

FIG. 6. illustrates another exemplary embodiment of the present invention, in which common numerals refer to the common elements illustrated in FIG. 4.

Referring to FIG. 6, power-on reset circuit 2 may include a switch 400, coupled between a power terminal VCC and a level detector 200. The switch 400 may operate in response to a power-on reset signal POR generated from a second node n2. If the POR signal is applied, then the power supply voltage VCC, which may be applied to the level detector 200, may be reduced and/or cut off. The switch 400 may thus reduce the amount of standby current flowing through the level detector 200.

The switch 400 may include two PMOS transistors P2 and P3. The source of PMOS transistor P2 may be connected to a power terminal VCC, the gate of P2 may be connected to a second node n2, and the drain of P2 may be connected to a voltage distribution circuit 210 of the level detector 200. The source of the PMOS transistor P3 may be connected to a power terminal VCC, the drain of P3 may be connected to a common-source amplifier 220, and the gate of P3 may be connected to the second node n2.

The operational characteristics of the power-on reset circuit 2, according to an exemplary embodiment of the present invention, will now be described with reference to FIGS. 6–7. For example, assuming that the threshold voltages of NMOS transistors N1, N2, and N3 are 0.5V and the threshold voltages of PMOS transistors P1, P2, and P3 are −0.7V, a voltage of a second node n2, of the power-on reset circuit 2, may fluctuate, as described below. When a power supply voltage VCC reaches 0.7V (the threshold voltage of the PMOS transistor being −0.7V and represented by a positive voltage 0.7 for convenience), the second node n2 may be in a reset-on state. When the power supply voltage rises to 1.5V and a voltage of a third node n3 reaches 0.5V (the threshold voltage of the NMOS transistor N1), the second node n2 may be in a reset-off state and a POR signal may be generated through the second node n2.

When the power supply voltage VCC drops such that the voltage of the second node n2 drops below 1.0V, which may be equal to the sum of the threshold voltages (VN2+VN3) of the NMOS transistors N2 and N3 at around time t4 upon power-down, the second node n2 may return to the reset-on state. When the power supply voltage continuously drops and the voltage of the second node n2 drop below 0.7V, which may be a threshold voltage of PMOS transistor P1 at around time t5, the second node may be in an unknown state.

Figure 7:
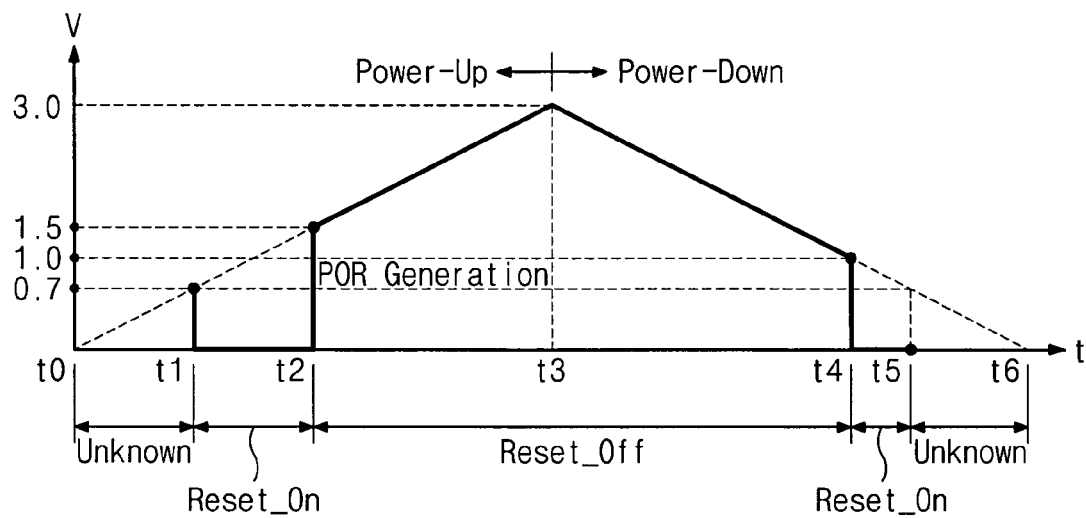
FIG. 7 is an example timing diagram illustrating the operational characteristics of the power-on reset circuit of FIG. 6.

Upon power-up, for example during the reset-on state time period t1–t2 illustrated in an exemplary embodiment of FIG. 7, the power supply voltage VCC may have a value between 0.7V and 1.5V, and the voltage of the second node n2 may be grounded (0V). The gate-source voltage Vgs of the PMOS transistors P2 and P3 may be valued between −0.7V and −1.5V. A PMOS transistor may be turned on when its gate-source voltage Vgs is lower than its threshold voltage, for example, the PMOS transistors P2 and P3 may be turned on during the t1–t2 time period. If P2 and P3 are turned on then a power supply voltage for example VCC, may be applied to the voltage distribution circuit 210 and the common-source amplifier 220, of the level detector 200.

If a power-on reset POR signal is generated in the reset-off state, the power supply voltage VCC may be higher than 1.5V and the voltage of the second node n2 may be the same as the power supply voltage VCC due to saturation of one or more transistors coupled to n2. The gate-source voltage Vgs of the PMOS transistors P2 and P3, although negative, may be at a level of magnitude higher than the threshold voltage −0.7V. Therefore, P2 and P3 may be turned off, thus no standby current may be flowing between a power terminal and the level detector 200, while in a reset-off state.

Figure 8:
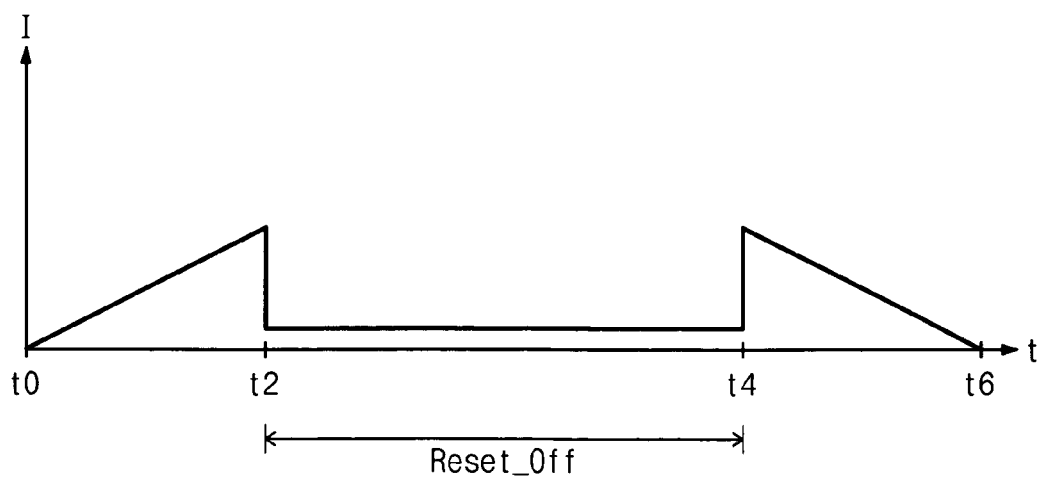
FIG. 8 is an example timing diagram illustrating the power consumption of the power-on reset circuit of FIG. 6.

Referring to FIGS. 6–8, in accordance with an exemplary embodiment of the present invention, the PMOS transistors P2 and P3 may be in a turn-on or a turn-off state during the unknown state. If a POR signal has not been generated during a time period for example, t0–t2 and if a power supply voltage VCC rises, then a standby current may also rise. During a time period of a reset-off state, for example t2–t4, where a POR signal is generated at the second node n2, the PMOS transistors P2 and P3 may be in a turn-off state. Therefore, depending upon the on or off state of the transistors, the chances of standby current being generated if the power supply voltage VCC continues to rise, may be reduced. However, at the time period, for example t4–t6, where the POR signal is subjected to a latch break occurring, the PMOS transistors may be in the turn-on state thus permitting a standby current to increase.

According to an exemplary embodiment of the present invention for the power-on reset circuit 2 illustrated in FIG. 6, standby current may only flow through a reset circuit 100 after a POR signal is generated. Therefore, the standby current may be reduced, for example, by around 90 percent when compared to conventional power-on circuits or similar types of conventional configurations.

As illustrated in FIGS. 4 and 6, the reset circuit 100, the pull-down driver 320, and the common-source amplifier 200 may include for example, only one PMOS transistor P1, only one NMOS transistor N3, and only one NMOS transistor N1, respectively. However, a plurality of transistors may be serially connected to regulate the voltages of the respective transistors.

Figure 9:
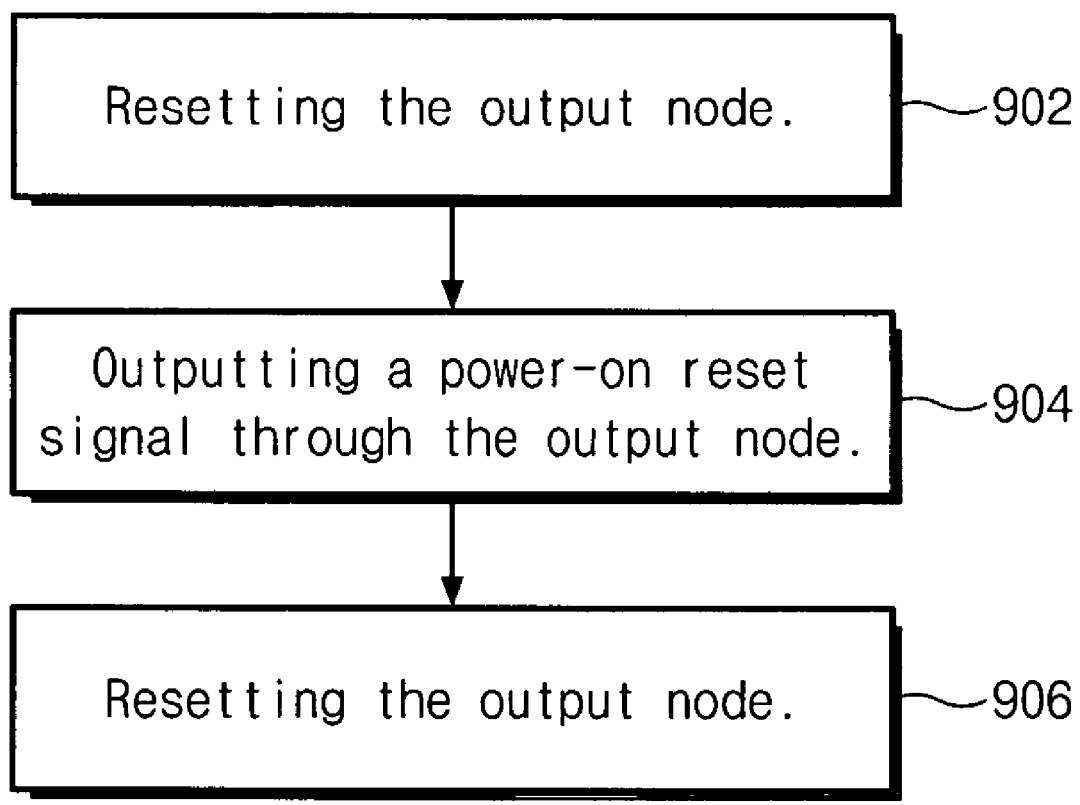
FIG. 9 is an example logic diagram illustrating the operation of a power-on reset circuit.
Figure 10:
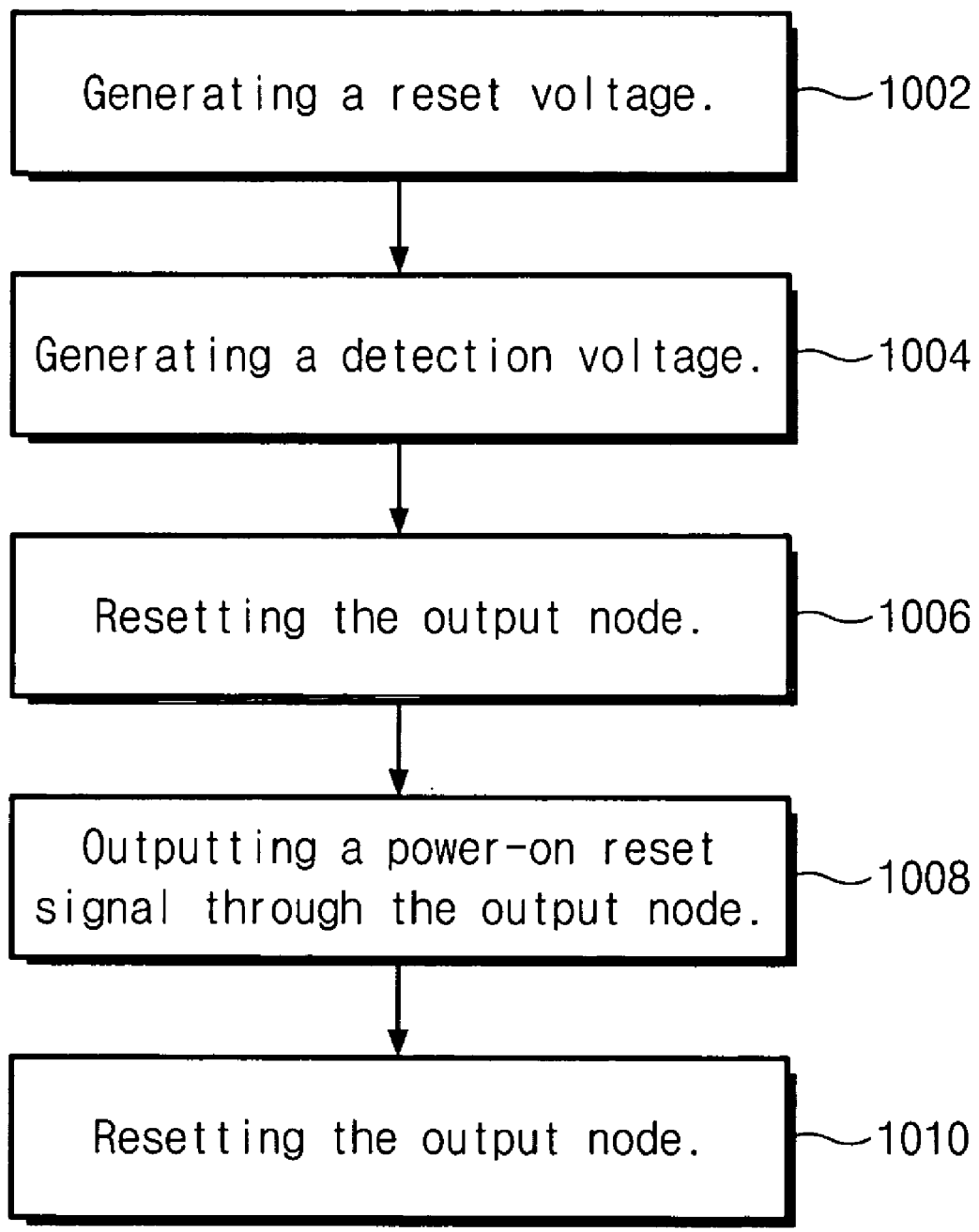
FIG. 10 is another example logic diagram illustrating the operation of a power-on reset circuit.

Referring to FIGS. 9–10, in accordance with an exemplary embodiment of the present invention, the operation of a power-on reset circuit may be described by resetting an output node of the power-on reset circuit (902), outputting a power-on reset signal through the output node (904) and resetting the output node (906), as illustrated in FIG. 9. However, the operation of a power-on reset circuit may also be described by generating a reset voltage (1002) and a detection voltage (1004), resetting an output node of the power-on reset circuit (1006), outputting a power-on reset signal through the output node (1008) and resetting the output node (1010), as illustrated in FIG. 10. The example operations illustrated in FIGS. 9–10 should be interpreted as limiting to the operation of the various exemplary embodiments described above.

Further, various exemplary embodiments have been above-described including NMOS and/or PMOS transistors. However, it is understood that NMOS and/or PMOS transistors may be used with other types of circuit components in other combinations with any of the above-described exemplary embodiments.

Such variations are not to be regarded as departure from the spirit and scope of the exemplary embodiments of the present invention, and all such modifications as would be obvious to one skilled in the art are intended to be included within the scope of the following claims.

What is claimed is:

1. A power-on reset circuit for outputting a power-on reset signal through an output node, comprising:
    a reset circuit for generating a reset voltage signal when a power supply voltage reaches a first voltage level;
    a level detector for generating a detection voltage signal when the power supply voltage reaches a second voltage level greater than the first voltage level;
    an output node coupled to receive a voltage signal; and
    a latch circuit for receiving the reset voltage signal from the reset circuit to reset the output node, and receiving the detection voltage signal from the level detector to output a power-on reset signal through the output node,
    wherein the latch circuit contains a pull-down driver including at least two NMOS transistors, one of which is diode-connected, and resets the voltage signal of the output node when a voltage of the output node reaches a third voltage level that is lower than the second voltage level and higher than the first voltage level.

2. The power-on reset circuit of claim 1, further comprising:
    a switch for cutting off a power supply voltage supplied to the level detector in response to the power-on reset signal.

3. A power-on reset circuit for outputting a power-on reset signal through an output node, comprising:
    a first node;
    a reset circuit for generating a reset voltage when a power supply voltage of a power terminal is higher than a first voltage level, the reset circuit being coupled between the power terminal and the first node;
    a level detector for generating a detection voltage when a power supply voltage of a power terminal reaches a second voltage level higher than the first voltage level, the level detector being coupled between the power terminal and the first node;
    an output node coupled to receive a voltage signal; and
    a latch circuit for receiving the reset voltage to reset the output node and receiving the detection voltage to output a power-on reset signal through the output node and to latch the power-on reset signal, the latch circuit being coupled between the first node and the output node,
    wherein the latch circuit contains a pull-down driver including at least two NMOS transistors, one of which is diode-connected, and receives the reset voltage to reset the output node when a voltage of the output node reaches a third voltage level that is lower than the second voltage level and is higher than the first voltage level.

4. The power-on reset circuit of claim 3, wherein the reset circuit includes,
    at least one PMOS transistor serially coupled between the power terminal and the first node;
    at least one gate of the at least one PMOS transistor is grounded; and
    a threshold voltage of the at least one PMOS transistors is the first voltage level.

5. The power-on reset circuit of claim 3, wherein the level detector comprises:
    a voltage distribution circuit for distributing a power supply voltage; and
    a common-source amplifier for generating the detection voltage in response to the distributed power supply voltage when the level of the power supply voltage reaches the second voltage level.

6. The power-on reset circuit of claim 5, wherein the voltage distribution circuit includes at least two resistors coupled between a power terminal and a ground, and a voltage gain of the common-source amplifier is about '−1'.

7. The power-on reset circuit of claim 5, wherein the common-source amplifier includes one or more NMOS transistors serially coupled between the first node and a ground, and the distributed voltage is applied to gates of the NMOS transistors.

8. The power-on reset circuit of claim 3, wherein the latch circuit includes an inverter coupled between the first node and the output node, and the pull-down driver latches the power-on reset signal in response to the power-on reset signal generated from an output node of the inverter.

9. The power-on reset circuit of claim 8, wherein the pull-down driver includes the at least two NMOS transistors having a threshold voltage equal to the third voltage level; and
    wherein the first NMOS transistor includes:
        a gate connected to the output node;
        a source serially coupled to at least another NMOS transistor that is diode-connected; and
        a drain connected to the first node.

10. The power-on reset circuit of claim 8, wherein, the pull-down driver includes the at least two NMOS transistors;
    wherein the first NMOS transistor includes:
        a gate connected to the output node;
        a drain connected to the first node; and
        a source serially coupled to at least another NMOS transistor;
    wherein the at least another NMOS transistor is serially coupled between a source of the first NMOS transistor and a ground; and
    wherein a gate and a drain of the at least another NMOS transistor are connected to each other and to the source of the first NMOS transistor.

11. The power-on reset circuit of claim 10, wherein:
    the third voltage level is a threshold voltage of the first and the at least another NMOS transistors.

12. The power-on reset circuit of claim 10, wherein:
    the threshold voltages of the first and the at least another NMOS transistors are the same.

13. The power-on reset circuit of claim 3, further comprising:
    a switch for cutting off a power supply voltage applied to the level detector in response to the power-on reset signal, wherein the switch is coupled between the power terminal and the level detector.

14. The power-on reset circuit of claim 13, wherein:
    the switch includes at least one PMOS transistor having:
        a source connected to the power terminal;
        a drain connected to the level detector; and
        a gate connected to the output node.

15. A method for outputting a power-on reset signal through an output node, comprising:
  (a) resetting the output node when a power supply voltage reaches a first voltage level;
  (b) outputting the power-on reset signal through the output node by latching at least two NMOS transistors, one of which is diode-connected, when the power supply voltage reaches a second voltage level higher than the first voltage level; and
  (c) resetting the output node when the power supply voltage reaches a third voltage level that is lower than the second voltage level and higher than the first voltage level.

16. A method for outputting the power-on reset signal through an output node, comprising:
  (a) generating a reset voltage when a power supply voltage reaches a first voltage level;
  (b) resetting the output node in response to the reset voltage;
  (c) generating a detection voltage when the power supply voltage reaches a second voltage level higher than the first voltage level;
  (d) outputting the power-on reset signal through the output node in response to the detection voltage by latching least two NMOS transistors, one of which is diode-connected; and
  (e) resetting the output node when a voltage of the output node becomes lower than the second voltage level and higher than the first voltage level.

17. The method of claim 16, further comprising:
  (d1) cutting off the generation of a detection voltage in response to the power-on reset signal.

18. An apparatus comprising:
  an output node; and
  a pull-down driver including at least two NMOS transistors, one of which is diode-connected, latching a voltage signal at the output node when the voltage signal is at a first voltage level, which is higher than a second voltage level and lower than a third voltage level; and
  wherein the pull-down driver acts as a latch break when the voltage signal at the output node is lower than the first voltage level, and
  wherein the NMOS transistor which is diode-connected is serially coupled between a source of another of the at least two NMOS transistors and around.

19. The apparatus of claim 18, wherein the latching is performed during a power-up cycle.

20. The apparatus of claim 18, wherein the latch break is performed during a power-down cycle.

21. A method comprising:
  latching a voltage signal with at least two NMOS transistors, one of which is diode-connected, when the voltage signal is at a first voltage level, which is higher than a second voltage level and lower than a third voltage level; and
  performing a latch break when the voltage signal is lower than the first voltage level, wherein the NMOS transistor which is diode-connected is serially coupled between a source of another of the at least two NMOS transistors and ground.

22. The method of claim 21, wherein the latching is performed during a power-up cycle.

23. The method of claim 21, wherein the latch break is performed during a power-down cycle.

24. The power-on reset circuit of claim 1, wherein the reset circuit generates a reset voltage during a power-up cycle.

25. The power-on reset circuit of claim 1, wherein the latch circuit resets the output node during a power-down cycle.

26. The power-on reset circuit of claim 1, wherein the latch circuit resets the output node to a ground voltage.

27. The power-on reset circuit of claim 3, wherein the reset circuit generates a reset voltage during a power-up cycle.

28. The power-on reset circuit of claim 3, wherein the latch circuit resets the output node during a power-down cycle.

29. The power-on reset circuit of claim 3, wherein the latch circuit resets the output node to a ground voltage.

30. The method of claim 15, wherein occurs during a power-up cycle.

31. The method of claim 15, wherein occurs during a power-down cycle.

32. The method of claim 15, wherein and occur during a power-up cycle.

33. An apparatus comprising:
  an output node;
  a power supply for generating a power supply voltage signal;
  a reset circuit for generating a reset voltage signal when the power supply voltage signal reaches a threshold voltage level; and
  a latch circuit including a pull-down driver that includes at least two NMOS transistors, one of which is diode-connected;
  wherein the latch circuit receives the reset voltage signal and resets the output node, and
  wherein the NMOS transistor which is diode-connected is serially coupled between a source of another of the at least two NMOS transistors and around.

34. A method for providing a reset voltage signal to an output node comprising:
  generating a power supply voltage signal;
  generating the reset voltage signal when the power supply voltage signal reaches a threshold voltage level; and
  resetting the output node via the reset voltage signal using a latch circuit including a pull-down driver that includes at least two NMOS transistors, one of which is diode-connected, wherein the NMOS transistor which is diode-connected is serially coupled between a source of another of the at least two NMOS transistors and around.

35. A power-on reset circuit for performing the method of claim 15.

36. An apparatus for performing the method of claim 21.

37. The method of claim 15, further comprising:
  (d) latching a voltage signal when the voltage signal is at the first voltage level; and
  (e) performing a latch break when the voltage signal is lower than the first voltage level.

38. An apparatus for performing the method of claim 34.

* * * * *